US012770669B1

(12) United States Patent
Henry et al.

(10) Patent No.: US 12,770,669 B1
(45) Date of Patent: Oct. 20, 2026

(54) COMPLEMENTARY FERROELECTRIC LOGIC

(71) Applicants: National Technology & Engineering Solutions of Sandia, LLC, Albuquerque, NM (US); University of Virginia Patent Foundation, Charlottesville, VA (US)

(72) Inventors: Michael David Henry, Albuquerque, NM (US); Todd Bauer, Albuquerque, NM (US); Giovanni Esteves, Albuquerque, NM (US); Jon F. Ihlefeld, Charlottesville, VA (US)

(73) Assignees: National Technology & Engineering Solutions of Sandia, LLC, Albuquerque, NM (US); University of Virginia Patent Foundation, Charlotsville, VA (US)

( * ) Notice: Subject to any disclaimer, the term of this patent is extended or adjusted under 35 U.S.C. 154(b) by 326 days.

(21) Appl. No.: 18/391,785

(22) Filed: Dec. 21, 2023

Related U.S. Application Data

(60) Provisional application No. 63/434,270, filed on Dec. 21, 2022.

(51) Int. Cl.
*G11C 11/22* (2006.01)

(52) U.S. Cl.
CPC ...... *G11C 11/2275* (2013.01); *G11C 11/2273* (2013.01); *G11C 11/2277* (2013.01)

(58) Field of Classification Search
CPC ............ G11C 11/2275; G11C 11/2273; G11C 11/2277

(Continued)

(56) References Cited

U.S. PATENT DOCUMENTS 10,096,619 B2 * 10/2018 Ino .......................... H10B 51/30
11,244,999 B2 * 2/2022 Frank ................... H10N 70/826

(Continued)

OTHER PUBLICATIONS

Lim, S. et al., "Dual-Mode Operations of Self-Rectifying Ferroelectric Tunnel Junction Crosspoint Array for High-Density Integration of IoT Devices," IEEE Journal of Solid-State Circuits (2023) 58(7):1860-1870.

(Continued)

*Primary Examiner* — Connie C Yoha
(74) *Attorney, Agent, or Firm* — Mark A. Dodd

(57) ABSTRACT

A new form of logic and processing functionality, complementary ferroelectric logic (CFL), which employs ferroelectric tunnel junction (FTJ) devices as the underlying building blocks, is disclosed. By interconnecting the FTJ devices, one can implement various logical functions and memory devices. Of particular note is that the memory devices retain their written states even when power is removed, i.e., CFL memory is nonvolatile, due to the polarization retention properties of the ferroelectric material in the FTJ devices. Exemplary CFL logic functions include inverter (NOR), NAND, and multi-input comparison circuits. The CFL circuits include a writing pulse step to store either a logic "0" or "1" state, followed by a low voltage read pulse to output the implemented logic function. Due to the CMOS-compatible processes required to fabricate CFL circuits, CFL may be heterogeneously integrated with standard CMOS circuitry.

19 Claims, 13 Drawing Sheets

(58) Field of Classification Search
USPC .......................................................... 365/145
See application file for complete search history.

(56) References Cited

U.S. PATENT DOCUMENTS 11,805,657 B2 * 10/2023 Manfrini ................ H10B 51/30
12,223,993 B2 * 2/2025 Jung .................. G11C 11/2297

OTHER PUBLICATIONS

Sun, Q. et al., "Total ionizing dose effects of 60Co γ-rays radiation on HfxZr1—xO2 ferroelectric thin film capacitors," Journal of Materials Science: Materials in Electronics (2020) 31:2049-2056.

* cited by examiner

COMPLEMENTARY FERROELECTRIC LOGIC

CROSS-REFERENCE TO RELATED APPLICATIONS

This application claims priority to U.S. Provisional Application No. 63/434,270, filed on Dec. 21, 2022, and entitled COMPLEMENTARY FERROELECTRIC LOGIC, the entirety of which is incorporated herein by reference.

STATEMENT OF GOVERNMENT SUPPORT

This invention was made with Government support under Contract No. DE-NA0003525 awarded by the United States Department of Energy/National Nuclear Security Administration. The U.S. Government has certain rights in the invention.

BACKGROUND OF THE INVENTION

Field of the Invention

The present invention relates to the use of ferroelectric material to form fundamental logic gates, and in particular, to form complementary ferroelectric logic (CFL).

Brief Description of the Related Art

Si-based complementary metal oxide semiconductor (CMOS) circuits are ubiquitous, as they are found in virtually every electronic device. While CMOS circuits have great capabilities, the rate of advancement of those capabilities, for example increased speed and reduced power, have slowed over the last few years. To continue their capability advancement, new technologies may be required. One example of these new technologies is heterogeneous integration (HI), in which additional capability is created by vertical integration. This vertical integration may, for example, provide additional memory or processing functionality. One critical point with HI is that it must be CMOS-compatible, i.e., it must not disturb the characteristics of the one or more CMOS die being integrated. This, for example, places an upper limit on any thermal processes employed by the HI fabrication process. Thus, the need exists for a way to provide increased memory or processing functionality without disturbing the characteristics of the underlying CMOS die.

SUMMARY OF THE INVENTION

One aspect of the present invention relates to complementary ferroelectric logic (CFL), which employs ferroelectric tunnel junction (FTJ) devices as the underlying building blocks. By interconnecting the FTJ devices, one can implement various logical functions and memory devices. Of particular note is that the memory devices retain their written states even when power is removed, i.e., CFL memory is nonvolatile, due to the polarization retention properties of the ferroelectric material in the FTJ devices. Exemplary CFL logic functions include inverter (NOR), NAND, and multi-input comparison circuits. The CFL circuits include a writing pulse step to store either a logic "0" or "1" state, followed by a low voltage read pulse to output the implemented logic function. Due to the CMOS-compatible processes required to fabricate CFL circuits, CFL may be heterogeneously integrated with standard CMOS circuitry.

In at least one embodiment of the invention, a device comprises an upper ferroelectric tunnel junction (FTJ) device (the upper FTJ device in one of a high or a low resistance state, receiving a write pulse and a subsequent read pulse), and a lower FTJ device electrically connected to the upper FTJ device at an intervening node (the lower FTJ device in one of the high or the low resistance state), the write pulse placing each of the upper and lower FTJ devices in a corresponding one of the high or the low resistance state and the subsequent read pulse causing the device to output, at the intervening node, an output pulse indicative of a logic state of the device.

In various embodiments, each of the upper and lower FTJ devices includes a metal-ferroelectric-metal (MFM) device; the metal in the MFM device includes Co, Cu, Ge, Ir, $IrO_2$, Nb, NbN, Ni, Pd, Pt, $RuO_2$, Si, Ta, TaN, TiN, and/or W; a first metal that forms a first metal layer of the MFM device is different from a second metal that forms a second metal layer of the MFM device; the intervening node electrically connects the second metal of the upper FTJ device with either the first or second metal of the lower FTJ device; and the ferroelectric in the MFM device includes Al, Ba, Be, Ca, Ce, Dy, Er, Eu, Ga, Gd, Ge, Hf, Ho, La, Lu, Mg, N, Nb, Nd, O, Pr, Sc, Si, Sm, Sr, Y, Yb, and/or Zr.

In various other embodiments, each of the upper and lower FTJ devices includes a respective NbN—$HfO_2$—Nb or NbN—HZO—Nb device; each of the upper and lower FTJ devices includes a respective metal-ferroelectric-insulator-metal (MFIM) device; the insulator in the MFIM device includes $AlO_x$, $SiO_2$, SiN, and/or $TaO_x$; a ratio of the resistances in the high resistance state to the low resistance state is at least approximately five; a magnitude of the write pulse is a function of a composition and a thickness of a ferroelectric layer in each of the first and second FTJ devices; a magnitude of the write pulse is at least approximately 2.0 V; and a magnitude of the read pulse is approximately 0.1 V.

In yet other embodiments, the device implements an inverter circuit; the device implements a NAND circuit and the device further comprises a second upper FTJ device in parallel with the upper FTJ device (the second upper FTJ device electrically connected to the intervening node, the second upper FTJ device in one of the high or the low resistance state, the second upper FTJ receiving a second write pulse placing each of the second upper and lower FTJ devices in a corresponding one of the high or the low resistance state); the device implements a nonvolatile memory cell and the device further comprising a comparator electrically connected to the intervening node (the comparator comparing the output pulse to a reference voltage and outputting a stored logic state based upon the comparison of the output pulse to the reference voltage); and the device further comprises a memory cell select switch (the memory cell select switch electrically connected on an input side to the intervening node and electrically connected on an output side to the comparator, the memory cell select switch selectively electrically coupling the intervening node to the comparator).

In still other embodiments, the device implements a multi-input comparison circuit and the device further comprises one or more additional upper FTJ devices (the one or more additional upper FTJ devices in parallel with the upper FTJ device, each of the additional upper FTJ devices electrically connected to the intervening node, each of the additional upper FTJ devices in the high or the low resistance state, each of the one or more additional upper FTJ devices receiving corresponding write pulses placing a corresponding one of the one or more additional upper FTJ devices and the lower FTJ device in a corresponding one of the high or the low resistance state), the logic state of the device is an intermediate logic state when resistance states of the upper FTJ device and the one or more additional upper FTJ devices are different; and corresponding sizes of the upper FTJ device and each of the one or more additional upper FTJ devices are different, the logic state of the device is one of a plurality of intermediate logic states when resistance states of the upper FTJ device and the one or more additional upper FTJ devices are different, and each of the plurality of intermediate logic states is indicative of which one of the upper FTJ device and the one or more additional upper FTJ devices is in a different resistance state.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION OF THE INVENTION

Figure 1A:
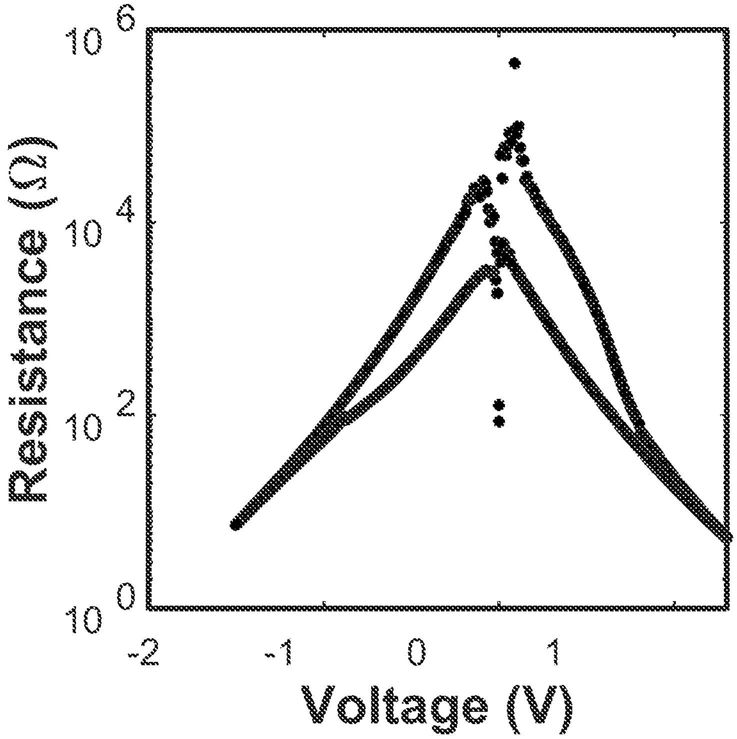
FIGS. 1A and 1B illustrate the measured voltage-resistance characteristics for ferroelectric tunnel junction (FTJ) devices in accordance with one or more embodiments of the present invention.

The terms "a" and "an" do not denote a limitation of quantity, but rather denote the presence of at least one of the referenced items. The term "or" means "and/or." The terms "comprising," "having," "including," and "containing" are to be construed as open-ended terms (i.e., meaning "including, but not limited to").

Ferroelectric Tunnel Junctions

Ferroelectricity is the property of a dielectric to retain an electric polarization P even when an applied electric field E is removed. This property is described by:

$$D=\varepsilon E+P \quad \text{(Eq. 1)}$$

Recent work has demonstrated that $HfO_2$ with low amounts of dopants, including, for example, Y or Si, can produce a ferroelectric material with a stabilized ferroelectric phase. Further, this area has expanded into alloying the $HfO_2$ with $ZrO_2$ additions as well as nanolaminates of $(Hf,Zr)O_2$. These films may, for example, be formed using an atomic layer deposition (ALD) process, with film thicknesses of less than 30 nm between two electrodes, thereby creating a metal-ferroelectric-metal (MFM) device. The ferroelectric material $(Hf,Zr)O_2$(HZO) has demonstrated a polarization P of up to approximately 30 $\mu C/cm^2$, with this ferroelectric property extending down to single nanometer thicknesses. Research has shown that HZO films are complementary metal oxide semiconductor (CMOS) compatible, and are widely utilized in fabrication facilities today. HZO films can be employed as part of front end of the line (FEOL) process flows in contact with silicon-based transistors. To date, the most significant applications of these devices has been as: (1) an MFM device coupled to a transistor as part of a ferroelectric random access memory (FeRAM), (2) a ferroelectric field effect transistor (FeFET) memory by adding the HZO on top of the gate electrode or directly onto the transistor channel to shift the threshold voltage based on polarization, and (3) as a ferroelectric tunnel junction (FTJ) device by making the HZO thin enough to allow tunnel current across an MFM device where the polarization shifts the barrier height and modulates the tunnel current.

Various embodiments of the present invention, through advantageous use of the electrode work functions/potentials, can shift the FTJ I-V characteristics. Specifically, by controlling how the tunnelling characteristics shift, one has control over device switching, which enables a new type of logic, which is termed complementary ferroelectric logic (CFL). By utilizing non-symmetric electrodes, with different metal work functions, an FTJ device can be altered such that when pulsed with a high voltage, the FTJ device is driven to a high resistance tunnel barrier state while a device with exactly opposite electrode work function can be driven to a low resistance tunnel barrier state. In at least one embodiment, a first FTJ device has NbN and Nb for the bottom and top electrodes, respectively, while a second FTJ device has Nb and NbN for the bottom and top electrodes, respectively. If a positive pulse drives the first FTJ device to a high resistance state, then symmetry demands that the second FTJ device would be driven to a low resistance state. This functionality is analogous to an N-type field effect transistor (FET) and a P-type FET in CMOS technology.

To demonstrate this behavior, an FTJ device was characterized where the bottom electrode (BE) and top electrode (TE) metallization are switched between NbN (with a known work function of approximately 4.7 eV), and Nb (with a known work function of approximately 4.4 eV). When the NbN is used as the BE and the Nb is the TE, sweeping the applied voltage to a high voltage flips the ferroelectric HZO such that current may more easily tunnel across the barrier. This higher tunnel current state will also be termed the low resistance state. Conversely, when the Nb is used at the BE and NbN is the TE, sweeping the applied voltage to a high positive voltage flips the ferroelectric HZO such that current is restricted by the barrier. This lower tunnel current state will also be termed the high resistance state. Sweeping the applied voltage back to a negative voltage again flips the ferroelectric barrier to the high resistance state and low resistance state for the NbN BE and Nb BE FTJ devices, respectively.

Figure 1B:
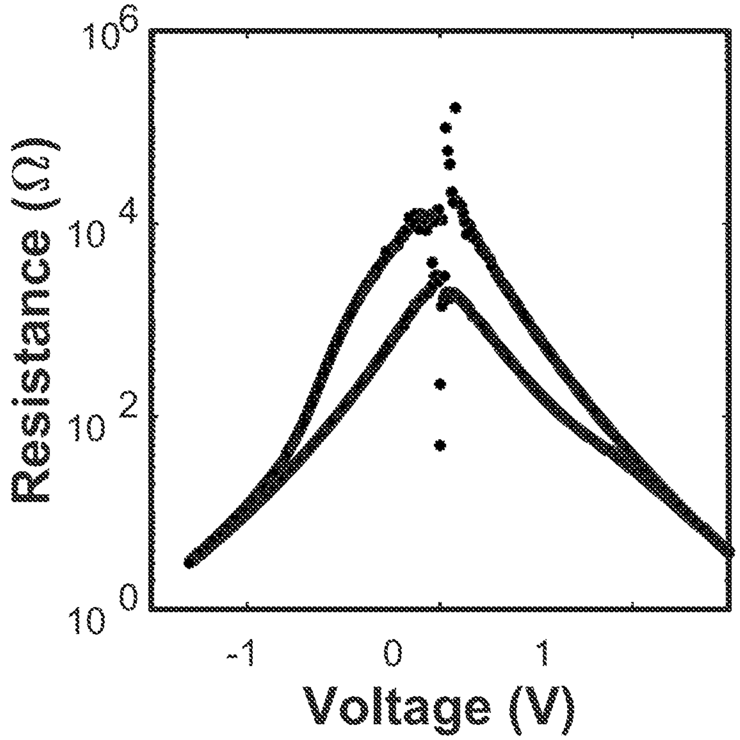

FIGS. 1A and 1B illustrate the measured voltage-resistance characteristics for FTJ devices in accordance with one or more embodiments. Specifically, FIG. 1A illustrates the measured voltage-resistance characteristics of an FTJ device having a diameter of 170 μm diameter and NBN and N as the BE and TE, respectively. Sweeping the voltage from −1.2 V to +1.2 V (red curve) demonstrates an exponential based tunnel current such that a high resistance state is obtained. As the voltage exceeds 0.7 V, the ferroelectric flips into a low resistance state. The voltage then sweeps back from +1.2 V to −1.2 V and device remains in the low resistance state. Complimentary to the device of FIG. 1A, a 145 mm diameter FTJ device with Nb and NbN as the BE and TE, respectively, with a thicker HZO layer, produced the voltage-resistance characterization curve illustrated in FIG. 1B. As this complementary FTJ device is swept from −1.5 V to +1.5 V, the low resistance state is observed, while the +1.5 V to −1.5 V sweep shows the complementary FTJ device is in the high resistance state.

Figure 2:
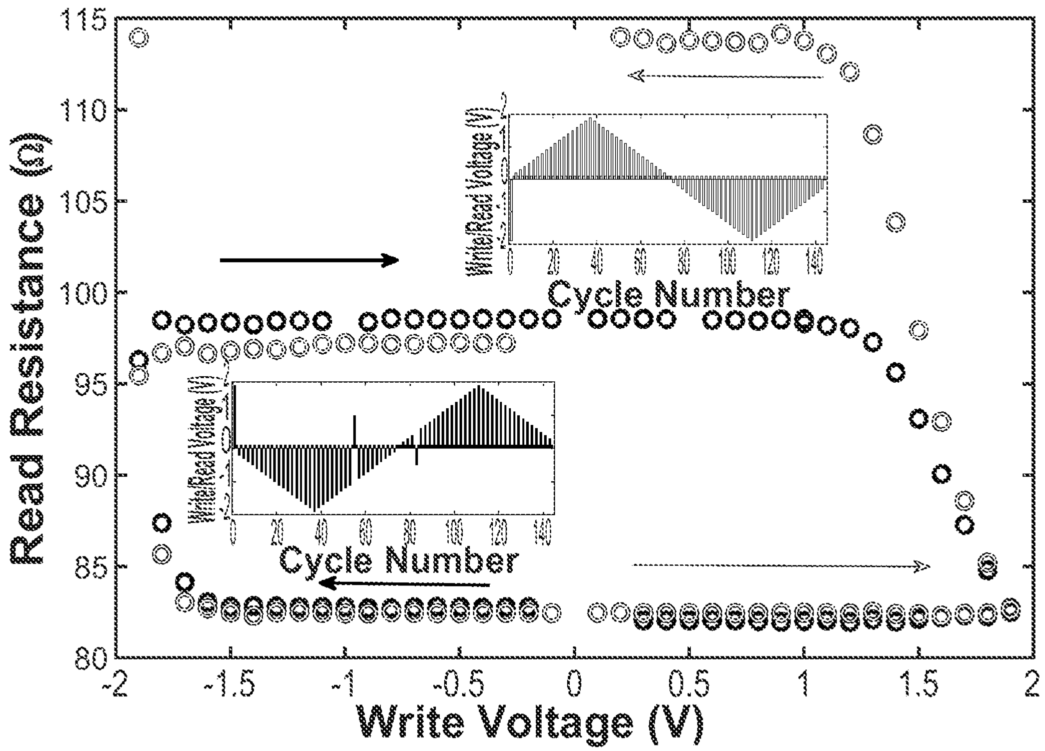
FIG. 2 illustrates the measured voltage-resistance characteristics for an FTJ device in accordance with one or more embodiments of the present invention.

One method to probe an FTJ device is thus to apply a large positive or negative voltage, but then follow that large voltage with a much smaller one. In that way, one can write to an FTJ device with a voltage of, for example, 2 V, and then to read out the FTJ device at a voltage of, for example, 0.1 V. Using the devices of FIGS. 1A and 1B as examples, their read resistances would be 160Ω (and 1,800Ω, respectively. Using this same write/read probing method, the hysteresis of the FTJ devices can be examined. FIG. 2 illustrates the measured voltage-resistance characteristics for an NbN BE/Nb TE FTJ device corresponding to that of FIG. 1A. The inset graphs are the applied voltages and the dots in the main graph are the observed output read resistances. Red denotes the application of an initial negative write voltage (−2.0 V), followed by interleaved read pulses of 0.1 V and write voltages of varied levels to read out the resistance of the FTJ device. To see the bidirectionality of the FTJ device, an initial positive write voltage (2.0 V), followed by interleaved read pulses of 0.1 V and write voltages of varied levels to read out the resistance of the FTJ device is denoted in blue. While ±2.0 V was employed as the write voltage in this discussion, the minimum magnitude write voltage is determined by the composition of the ferroelectric layer and its thickness. In particular, the minimum magnitude write voltage is the coercive voltage for the composition of the ferroelectric layer at its given thickness.

Figure 3A:
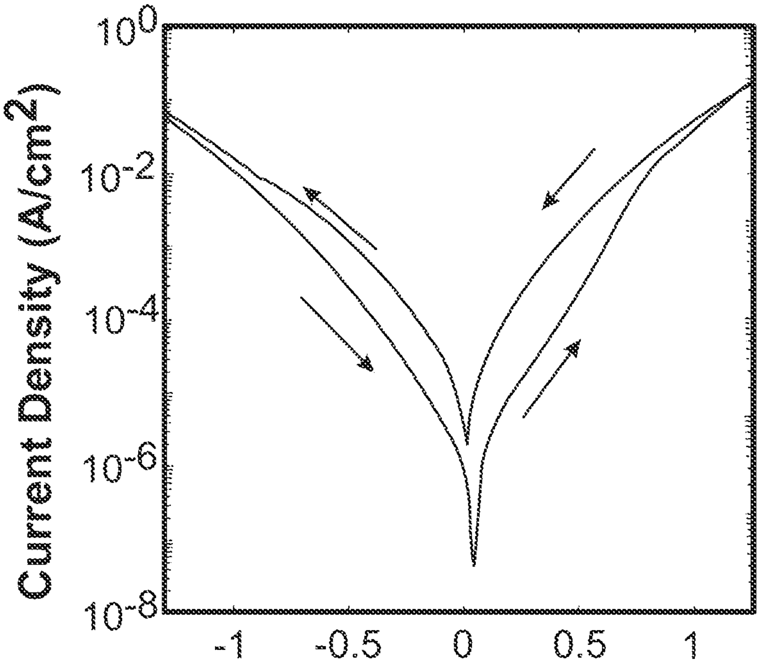
FIGS. 3A-3F illustrate the measured current-voltage, polarization-voltage, polarization-write cycle, polarization-read cycle, resistance-write voltage, and resistance-step number characteristics, respectively, for an FTJ device in accordance with one or more embodiments of the present invention.
Figure 3B:
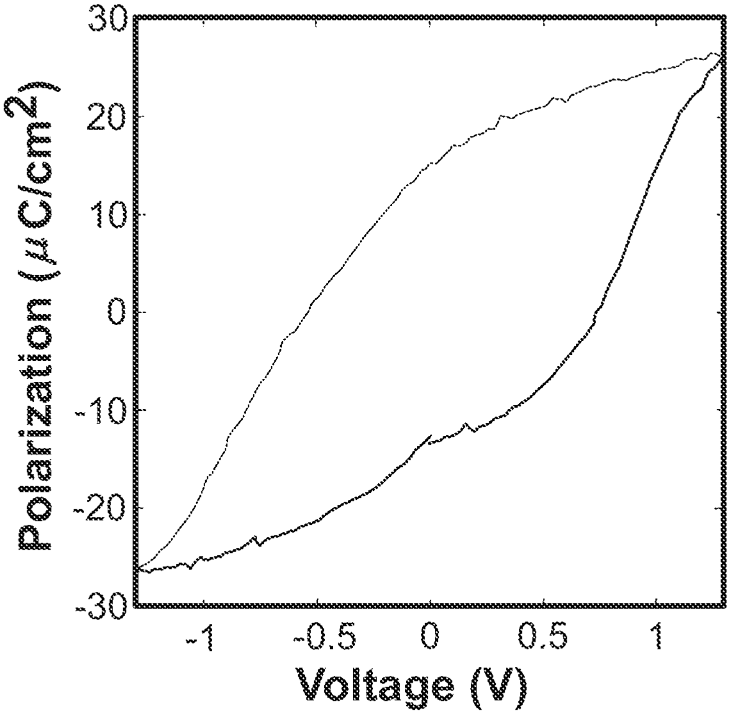
Figure 3C:
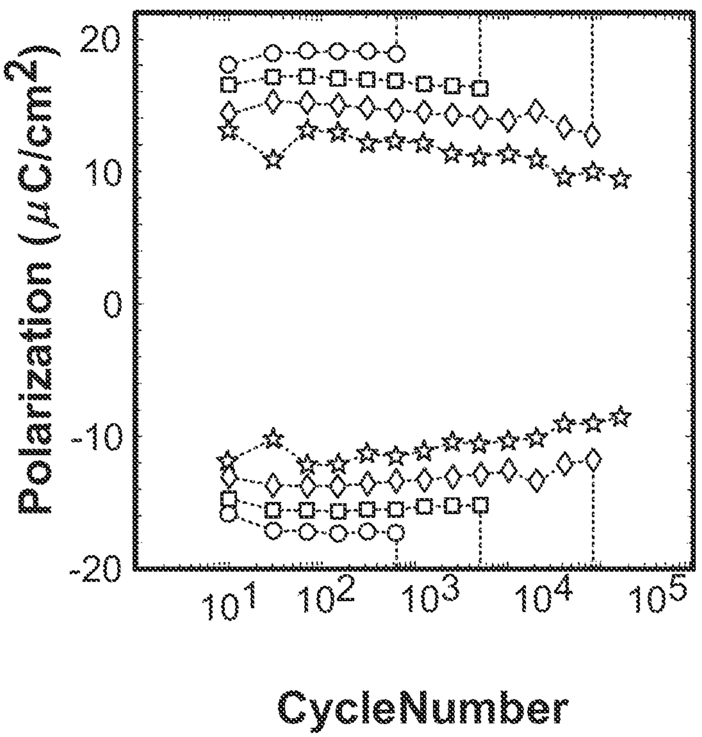
Figure 3D:
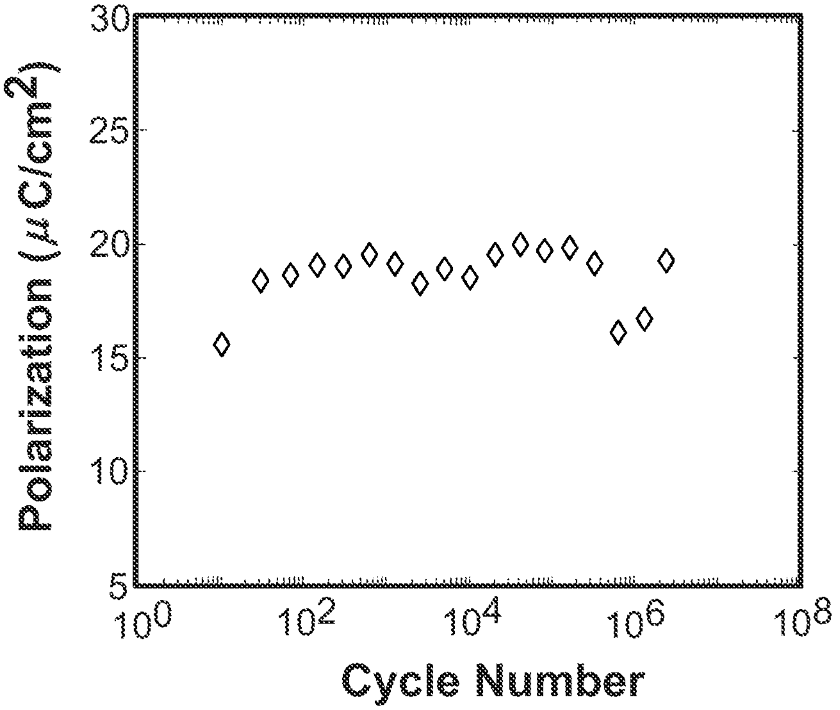
Figure 3E:
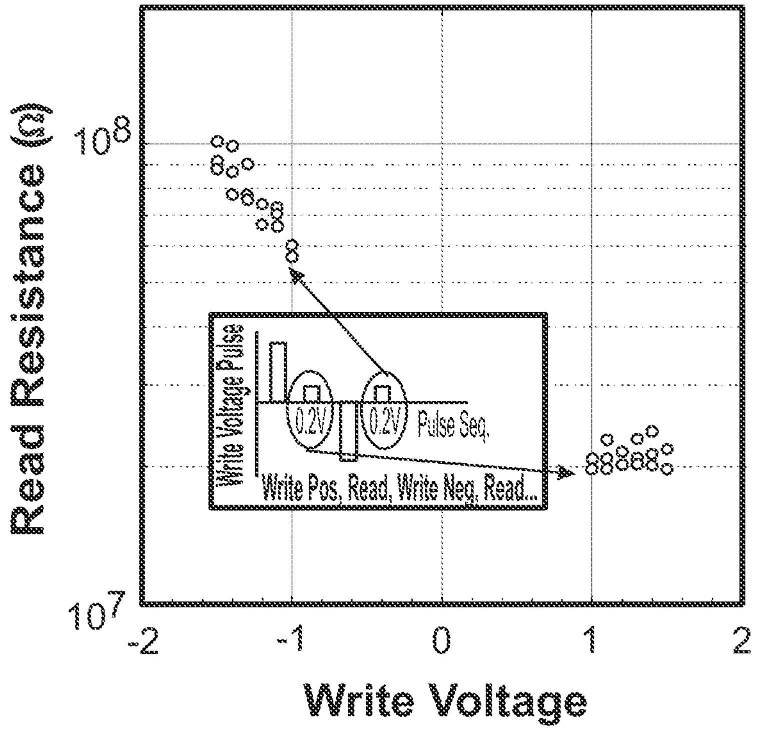
Figure 3F:
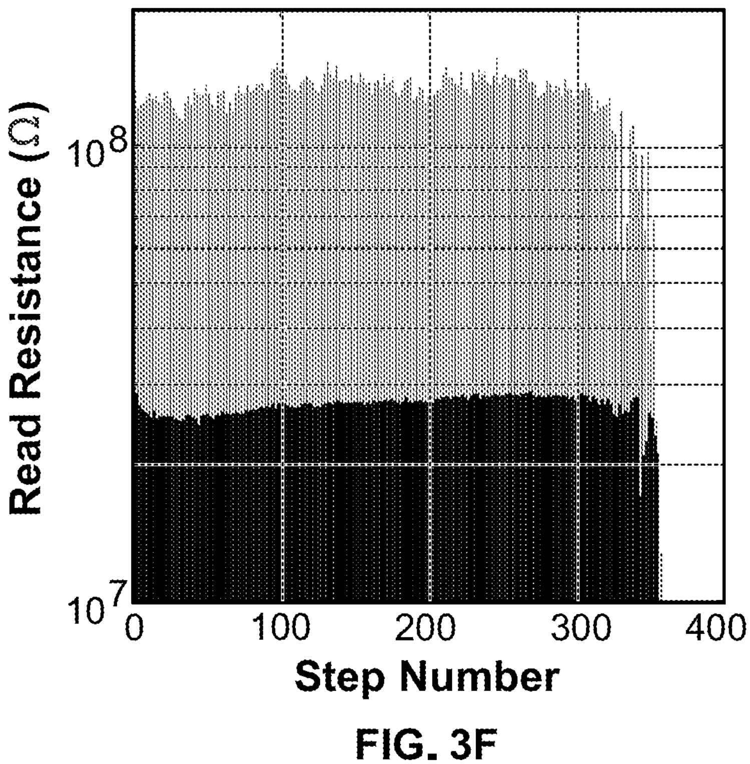

As FTJ devices form the building blocks of complementary ferroelectric logic (CFL) circuits, a number of FTJ devices were characterized in a number of ways. FIGS. 3A-3E illustrate various measurements taken for an FTJ device having a diameter of 60 μm with a structure employing NbN as the BE and Nb as the TE, with the intervening HZO layer having a thickness of 7 nm. FIG. 3A illustrates the I-V characteristics of the device, showing differences depending upon the state of the FTJ device, i.e., either high or low resistance state. FIG. 3B illustrates the measured polarization as a function of voltage, clearly showing the hysteresis necessary for a memory device. FIG. 3C illustrates the measured polarization as a function of the number of write cycles, i.e., write endurance, for the FTJ device for various write voltages having magnitudes of 1.2 V (stars), 1.3 V (diamonds), 1.4 V (squares), and 1.5 V (circles). As illustrated in FIG. 3C, the smallest write voltages survived over 105 write cycles. With a 1.5 V write voltage, a read voltage of 0.2 V, and a read pulse duration of 10 ms, the FTJ devices demonstrated a read endurance approaching 107 read cycles, as illustrated in FIG. 3D. FIG. 3E illustrates the measured read resistances over a range of positive and negative write voltages. Based upon the results illustrated in FIG. 3E, positive and negative write voltages of 1.0 V and −1.5 V, respectively, were selected to maximize the difference between the high and low resistance states. Lastly, FIG. 3F illustrates the read resistance as a function of read cycles when alternating between positive (1.0 V) and negative (−1.5 V) write pulses.

Figure 4:
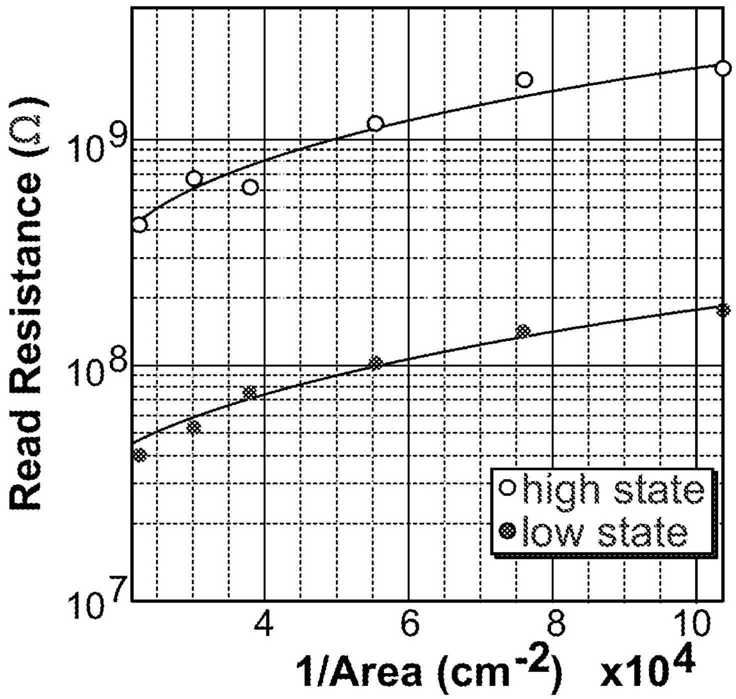
FIG. 4 illustrates the measured resistance-area characteristics for an FTJ device in accordance with one or more embodiments of the present invention.
Figure 5A:
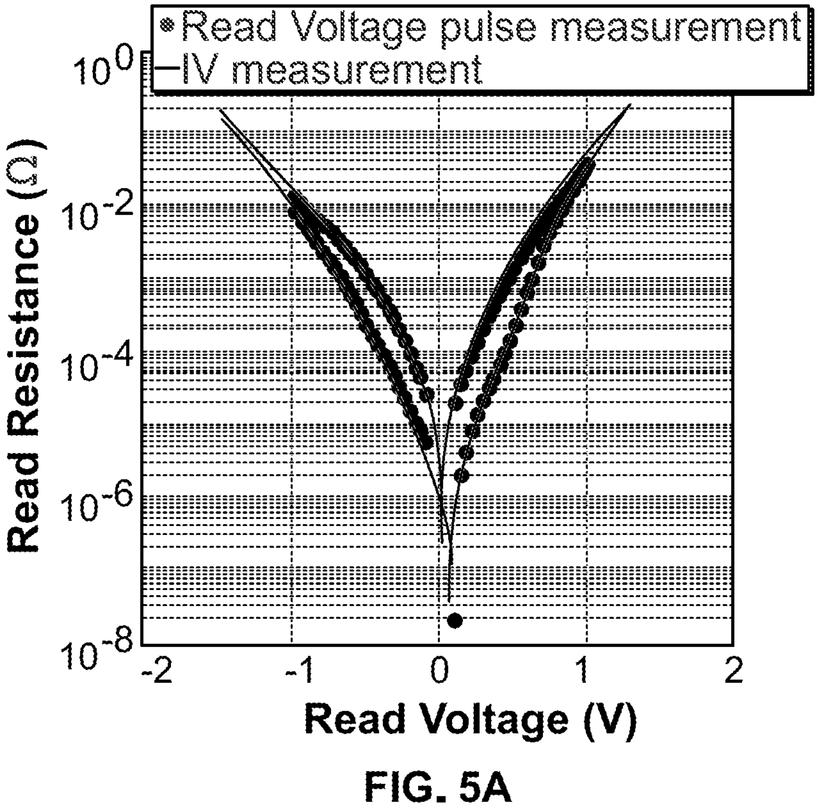
FIGS. 5A and 5B illustrate the measured current density-V and resistance ratio characteristics for an FTJ device in accordance with one or more embodiments of the present invention.
Figure 5B:
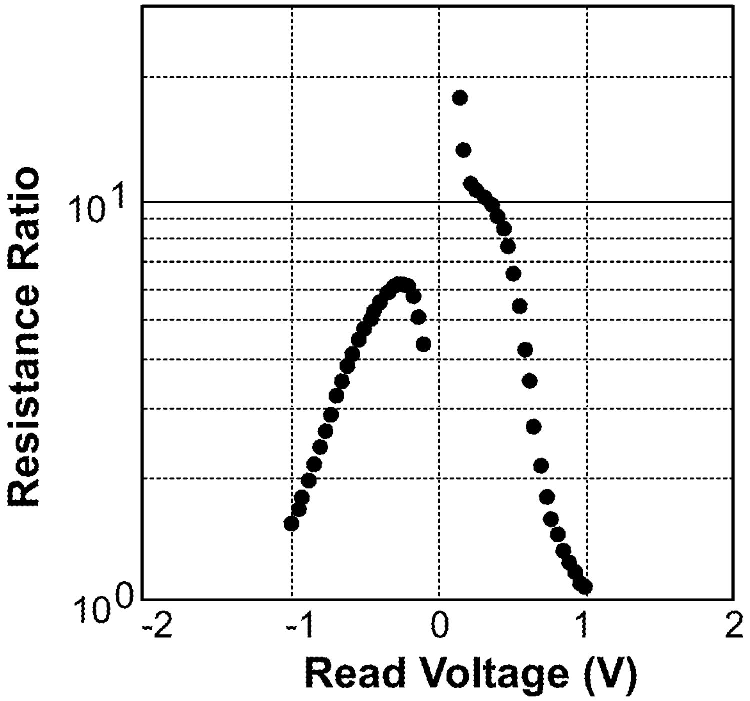

FIG. 4 illustrates the measured read resistances for various sizes of FTJ devices when in the high and low programmed states. The near linear dependence of the resistance on device area indicates that the resistance of the FTJ device, and thus its power consumption, can readily be employed as a design parameter. The ratio of the resistances in the high resistance state to the low resistance state was approximately ten for all device areas. FIGS. 5A and 5B illustrate the measured current density-V and resistance ratio characteristics for an FTJ device having a diameter of 100 μm with a structure employing NbN as the BE and Nb as the TE, with the intervening HZO layer having a thickness of 7 nm. As clearly illustrated in FIG. 5B, the resistance ratio, corresponding to the ratio of the resistances in the high resistance state to the low resistance state, has a peak value of approximately ten for read pulse voltages of approximately 0.1 V. The ratio of the resistances in the high resistance state to the low resistance state is preferably at least approximately five for FTJ devices as used in various embodiments.

Figure 6:
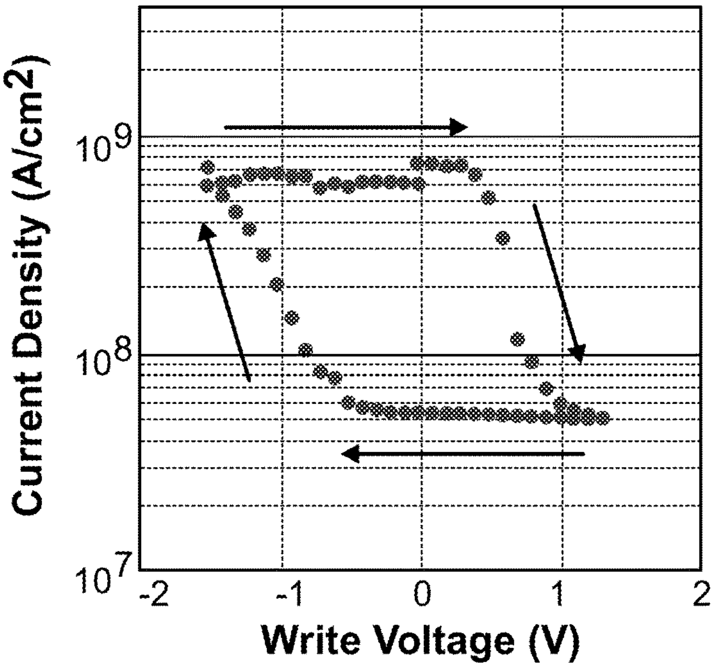
FIG. 6 illustrates a resistance hysteresis measurement for an FTJ device in accordance with one or more embodiments of the present invention.

Resistance hysteresis measurements are useful in determining when switching occurs between the high and low resistance states, the ratio of the resistances in the high resistance state to the low resistance state, and the presence of multistate resistances. For the resistance hysteresis measurement illustrated in FIG. 6, an initial write pulse of −1.5V was then followed by a series of pulses from 0 to 1.3 V, then back to −1.5V and then from −1.5 V to back to zero. In between each of the write voltages, a 0.2 V read voltage was used to measure the resistance of the FTJ device. During transitions between the high to low (~0.4 to ~0.7 V write voltage) and low to high (~−0.9 to ~−1.2 V write voltage) resistance states, the resistance shows some intermediate states when the new state is not completely set. This could be used to vary the output state and demonstrates a neuromorphic-like behavior, which may be useful for mimicking synapses in electronics.

Of particular note is that power utilization with FTJ devices is quite different than it is with standard CMOS technology. The first difference is that FTJ devices do not need to stay powered on. In contrast, CMOS technology uses a positive voltage rail (for example, 1.8 V, 3.3 V, 5.0 V, etc.), which needs to remain on to retain logic states. FTJ devices, and the complementary ferroelectric logic (CFL) circuits based thereon, employ large pulses (large enough to overcome the polarization coercive field) but then small enough to take advantage of the high resistances and low currents (resulting in a combined low power). When the pulse is off, or power to the CFL circuit is removed, the FTJ devices inherently store the logic states, thereby forming a non-volatile memory.

Figure 7:
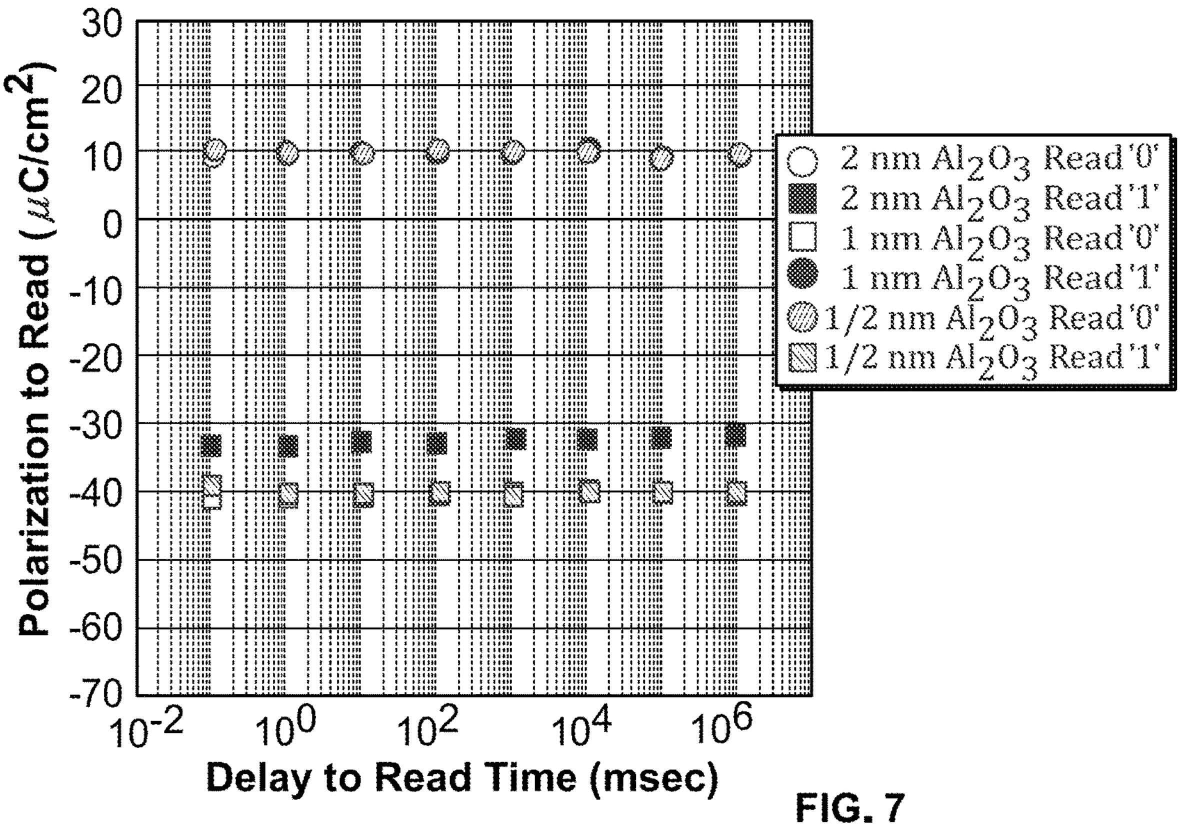
FIG. 7 illustrates the measured polarization as a function of the delay to read time for an FTJ device in accordance with one or more embodiments of the present invention.

This storage of logic states for FTJ devices was tested using a slightly modified FTJ device structure. In particular, a metal-ferroelectric-insulator-metal (MFIM) device was characterized with the HZO layer having a thickness of 20 nm and the insulator, the linear dielectric $AlO_x$ in this case, having a thickness of 0.5 nm, 1 nm, or 2 nm. Based on the measured retention illustrated in FIG. 7, the polarization remained substantially constant for delays between write and read of 106 msec, regardless of whether a logic "0" or a logic "1" was being written and read.

In a second comparison, CMOS technology utilizes two types of devices, N and P, and typically structures them with control over currents flowing through them in an "on" or "off" state by adjustment of the width and length of complementary devices. Currents in the FTJ devices used in CFL circuits scale based on their area (the currents are based on tunnelling or thermionic currents), and thus the resistance of FTJ devices can readily be controlled based upon area, as illustrated in FIG. 4. Further, the magnitude of switching currents for FTJ devices can be controlled by changing the ferroelectric thickness and adding an insulator (such as $SiO_x$ or $AlO_x$) between the metal and the ferroelectric layers. Specifically, adding the insulator layer increases the difference between currents in the high and low resistance states, resulting in a strong current-voltage asymmetry. Nominally thicker ferroelectrics have stronger ferroelectric switching, but can also reduce currents due to their greater thickness, which increases the resistance. Further, optimizing the added insulator layer may increase the difference between stored logic states. The magnitude of the tunnelling current in FTJ devices is also a function of the stoichiometry of the ferroelectric layer and the work function of the TE and BE. Unlike CMOS devices, complimentary FTJ devices can be made simply by reversing polarity of the electrodes, as described below with respect to FIGS. 10A and 10B.

It must be noted that the FTJ devices may be electrically interconnected as desired to implement any number of desired functions. However, because the FTJ devices may be fabricated as a back-end-of line (BEOL) process, the FTJ devices may be combined with CMOS devices. This creates a hybrid circuit that can use both FTJ devices and CMOS devices to their best advantage.

Complementary Ferroelectric Logic Functions and Circuits

Inverter Circuit

Figure 8:
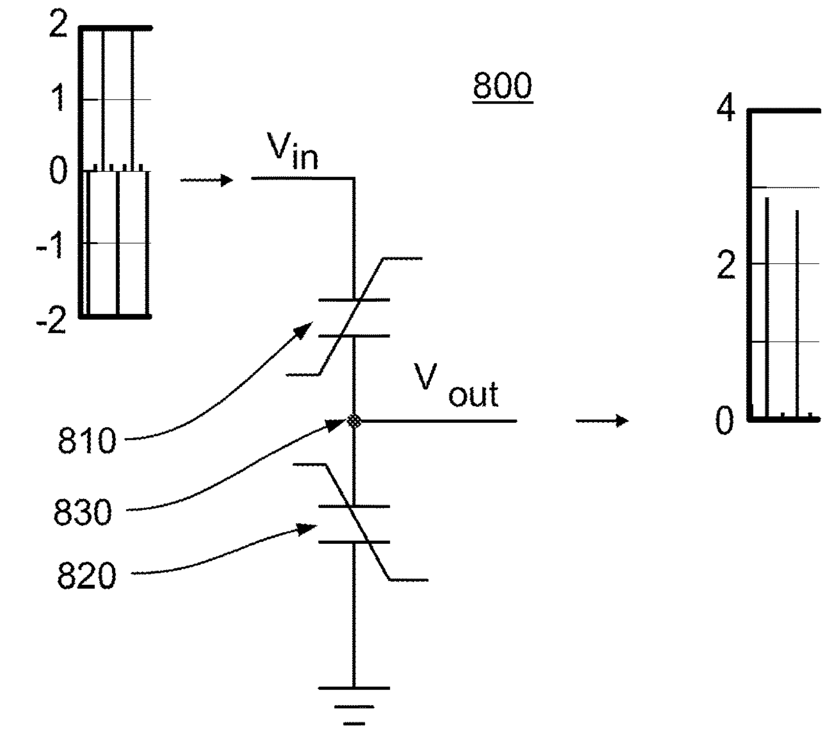
FIG. 8 illustrates an inverter circuit in accordance with one or more embodiments of the present invention.

Perhaps the simplest complementary ferroelectric logic (CFL) function to implement is an inverter (or NOT gate) circuit. An inverter circuit 800 in accordance with at least one embodiment is illustrated in FIG. 8. In CMOS, an inverter circuit is formed by coupling the drain of a P-FET to the drain of an N-FET, with the two gates receiving the input while the output corresponds to the potential at the coupled drains. When a positive pulse (logic "1") is applied to the input, the P-FET switches off and N-FET turns on, causing the output of the inverter device to go low (logic "0"). When a low pulse (logic "0") is applied to the input, the P-FET turns on and the N-FET turns off, causing the output of the inverter circuit to go high (logic "1").

With CFL, the two complementary FTJ devices described above with reference to FIGS. 1A and 1B are utilized in the same complementary fashion to create an inverter circuit 800. In one embodiment, an upper FTJ device 810, which when pulsed to positive voltages drives the upper FTJ device 810 to the low resistance state, is defined as a positive-low (PL) device. The upper FTJ/PL device 810 is formed of the Nb(BE)/HZO/NbN(TE) device illustrated in FIG. 1B. In contrast, a lower FTJ device 820, which when pulsed to positive voltages drives the lower FTJ device 820 to the high resistance state, is defined as a positive-high (PH) device. The lower FTJ/PH device 820 is formed of the NbN(BE)/HZO/Nb(TE) device illustrated in FIG. 1A. The PL device 810 is electrically interconnected with the PH device 820 at an intervening node 830. As illustrated in FIG. 8, when a 2.0 V pulse is applied to the top (input) of the inverter circuit 800, the PH device 820 transitions to a high impedance state and the PL device 810 transitions to a low impedance state. The output voltage then goes to a low or ground potential. In contrast, when a −2.0 V pulse is applied to the top of the inverter circuit 800, the PH device 820 transitions to a low impedance state and the PL device 810 transitions to a high impedance state. The output voltage then goes to a high potential. These input and output pulses are illustrated in the left and right insets to FIG. 8, respectively. In the inverter circuit 800 illustrated in FIG. 8, the 2.0 V pulse is followed by a low voltage pulse, for example, 0.1 V, denoted as a "read" pulse, whereas the 2.0 V is denoted as a "write" pulse. The output voltage during a read pulse indicates a logical state of the inverter circuit 800. For example, when the inverter circuit 800 has received a positive write pulse (2.0 V), which places the inverter circuit 800 in the logic "1" state, the output pulse voltage during the read pulse will be approximately 50 μV, indicative of a logic "0," as expected for the inverter circuit 800. In contrast, when the inverter circuit 800 has received a negative write pulse (−2.0 V), which places the inverter circuit 800 in the logic "0" state, the output pulse voltage during the read pulse will be approximately 3 mV, indicative of a logic "1," again as expected for the inverter circuit 800.

With the inverter circuit 800, the output is measured as a voltage. Due to the high symmetry observed in the measured current-voltage curve illustrated in FIG. 5A, the magnitude of the voltage differential is quite low. If the PL device 810 and the PH device 820 have, for example, the same area and the current density through them is approximately $10^{-4}$ A/cm$^2$, then the magnitude of the voltage differential is 0.4 V-0.2 V=0.2 V. However, by including the insulator layer described above, the resulting strong current-voltage asymmetry will produce a voltage differential having a far larger magnitude. In this insulator layer case, if the PL device 810 and the PH device 820 have, for example, the same area and the current density through them is approximately $10^{-4}$ A/$cm^2$, then the magnitude of the voltage differential is expected to be at least 0.5 V.

Figure 9A:
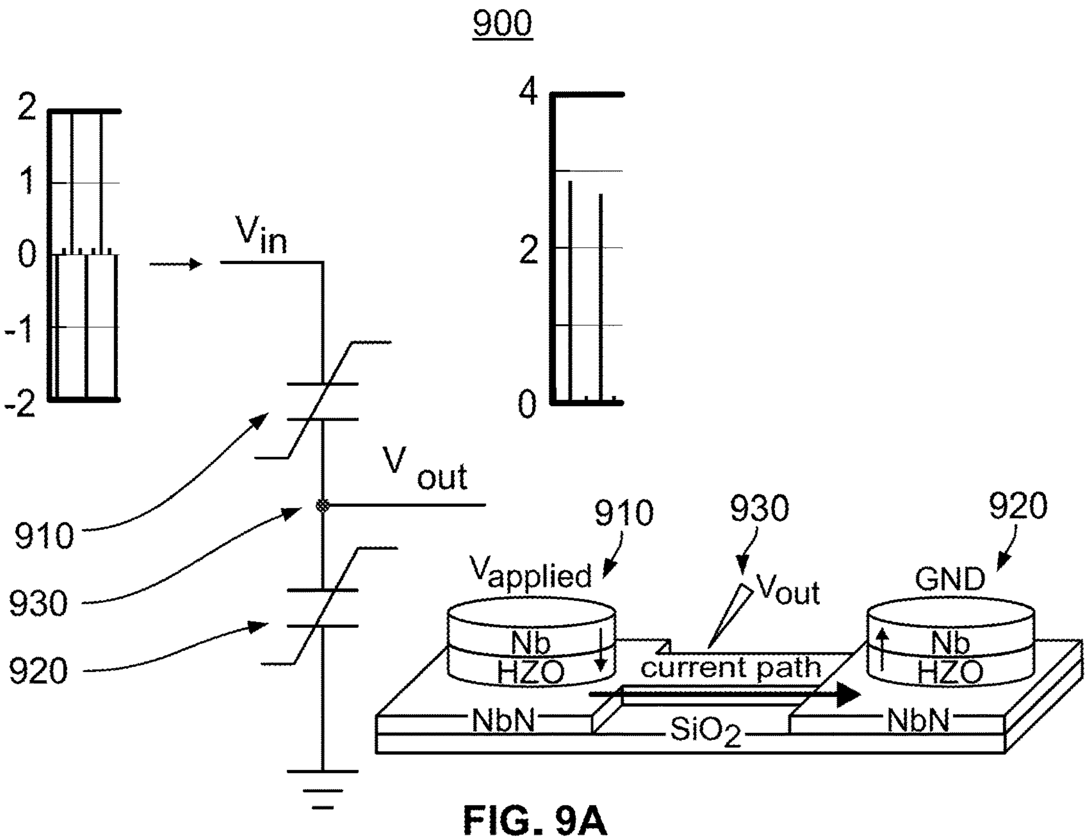
FIGS. 9A and 9B illustrate an inverter circuit and measured characteristics, respectively, for an inverter circuit in accordance with one or more embodiments of the present invention.

An alternative inverter circuit 900 in accordance with one or more other embodiments is illustrated in FIG. 9A, with the lower right inset illustrating the corresponding physical configuration. The inverter circuit 900 employs two PL devices 910, 920 corresponding to the NbN(BE)/HZO/Nb (TE) device illustrated in FIG. 1A. In this design, the input is applied to the TE of the first PL device 910, while the TE of the second PL device 920 is connected to ground, while the output is taken from the exposed common BE. The first PL device 910 is electrically interconnected with the second PL device 920 via the common BE, corresponding to an intervening node 930. This architecture achieves the same reversal of the electrode work functions, but enables the inverter circuit 900 to be made of the same metallization for both PL devices. This is due to the fact that grounding the TE of the second PL device 920 causes the second PL device 920 to act as a PH device.

Figure 9B:
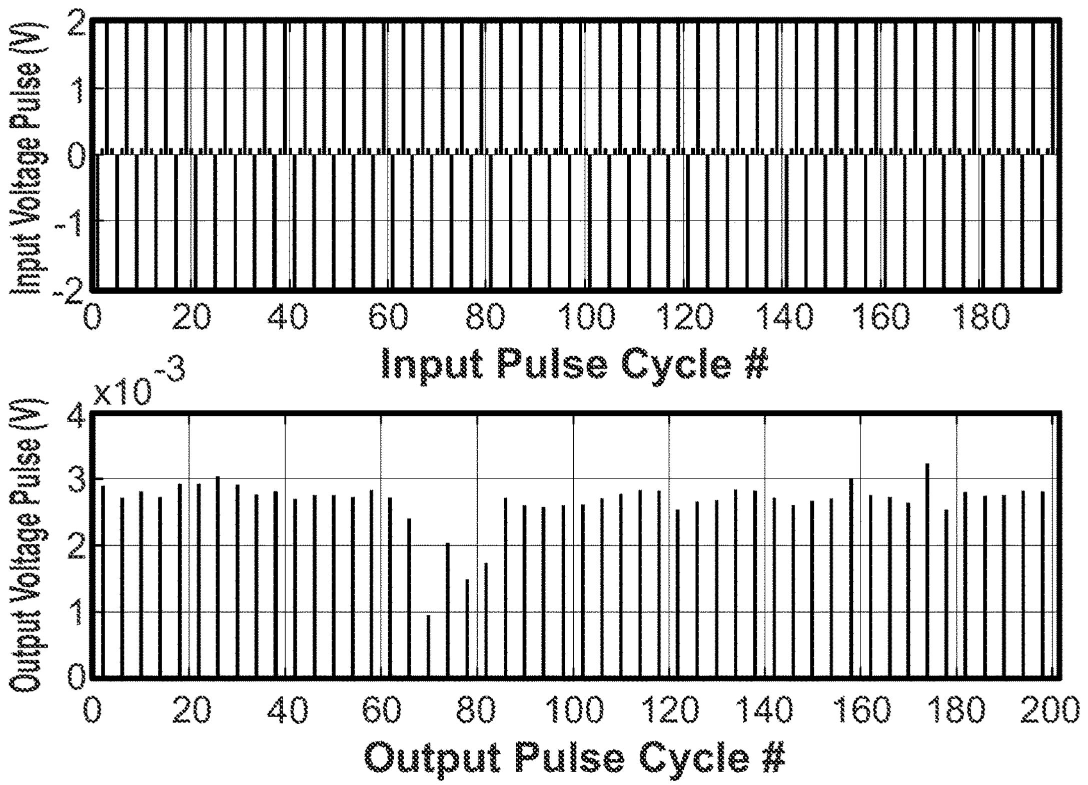

Characterization results of the inverter circuit 900 illustrated in FIG. 9A are illustrated in FIG. 9B. The output pulse is now a fraction of the read pulse. For example, the output pulse is approximately 3 mV (indicative of a logic "1") when the input write pulse was set to −2.0 V (corresponding to a logic "0") and then read with an input pulse at 0.1 V. In contrast, when the input write pulse was set to +2.0 V (corresponding to a logic "1"), and then read with an input pulse of 0.1 V, the output pulse is approximately 50 μV (indicative of a logic "0").

Figure 10A:
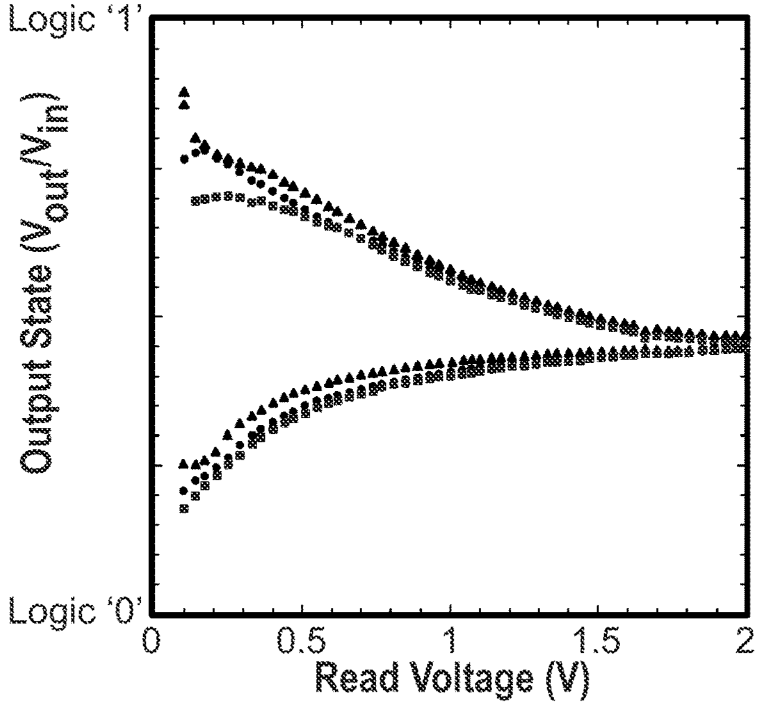
FIGS. 10A and 10B illustrate the measured output state as a function of the read voltage and the energy per read as a function of read voltage, respectively, for an inverter circuit in accordance with one or more embodiments of the present invention.
Figure 10B:
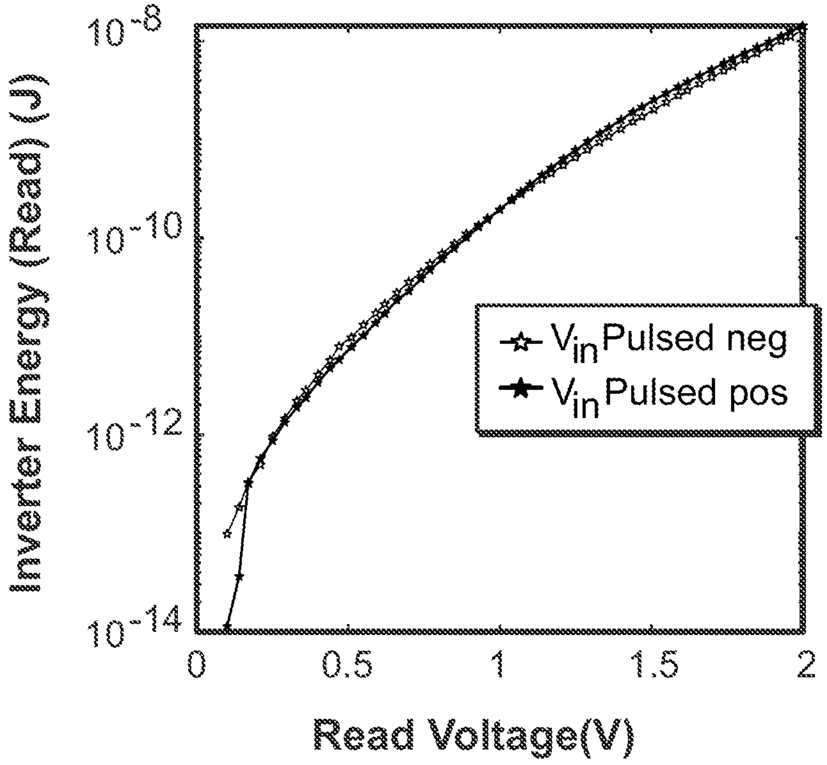

FIG. 10A illustrates the output state ratio, i.e., $V_{out}/V_{in}$ as a function of the read pulse voltage in both the logic "1" and logic "0" states for an inverter circuit corresponding to that of FIG. 9A. Note that the upper and lower series of three dots correspond to difference device radii (30 μm, 40 μm, and 50 μm). The greatest difference in the output state ratio is achieved with small read pulse voltages, for example approximately 0.1 V. As the read pulse voltage increases, the output state ratios in the logic "1" and logic "0" states approach each other, indicating that it becomes very difficult at high read pulse voltages to distinguish between the logic "1" and logic "0" states. FIG. 10B illustrates the energy required per read cycle for both logic "1" and logic "0" states. As illustrated, the energy per read cycle at the lowest read pulse voltages, approximately 0.1 V, are in the range of $1\text{-}2\times10^{-13}$ J/read.

NAND Circuit

Figure 11A:
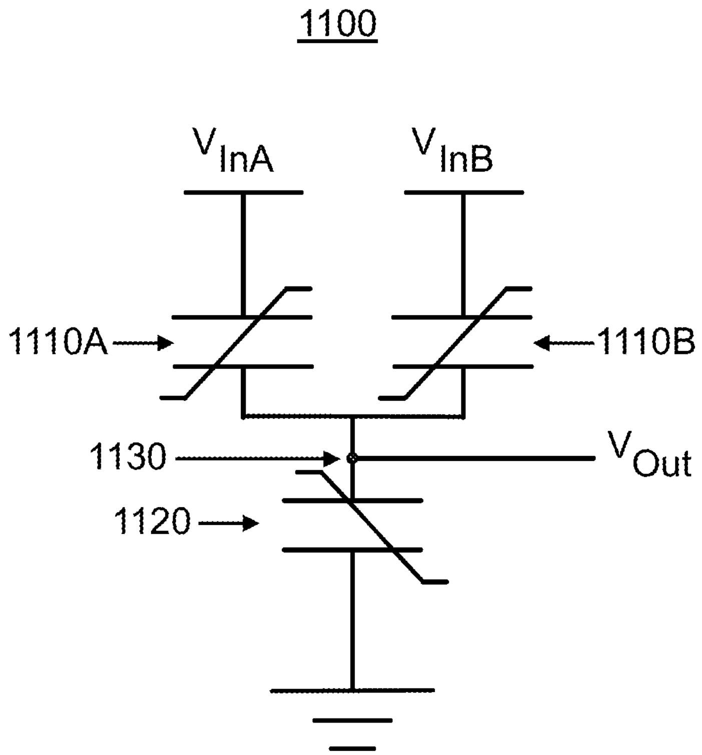
FIGS. 11A, 11B, and 11C illustrate a NAND circuit, a fabricated NAND circuit, and simulated characteristics, respectively, for a NAND circuit in accordance with one or more embodiments of the present invention.
Figure 11B:
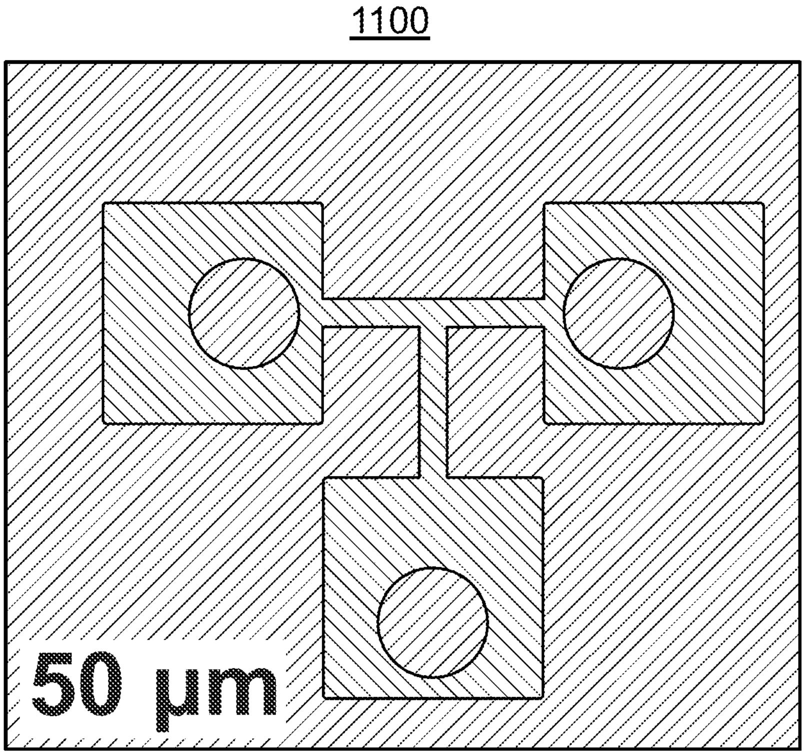

FIG. 11A illustrates a NAND circuit 1100 implemented using FTJ devices, while FIG. 11B illustrates a corresponding fabricated NAND circuit 1100. Specifically, the NAND circuit 1100 employs two upper FTJ devices 1110A, 1110B, though additional upper FTJ devices may be employed if more than a two-input NAND circuit is desired. Both of the upper FTJ devices 1110A, 1110B are PL devices. The NAND circuit 1100 further employs a lower FTJ device 1120, which is a PH device. The outputs of the two upper FTJ devices 1110A, 1110B are coupled to the input of the lower FTJ device 1120, with the output 1130 corresponding to this intervening node.

Figure 11C:
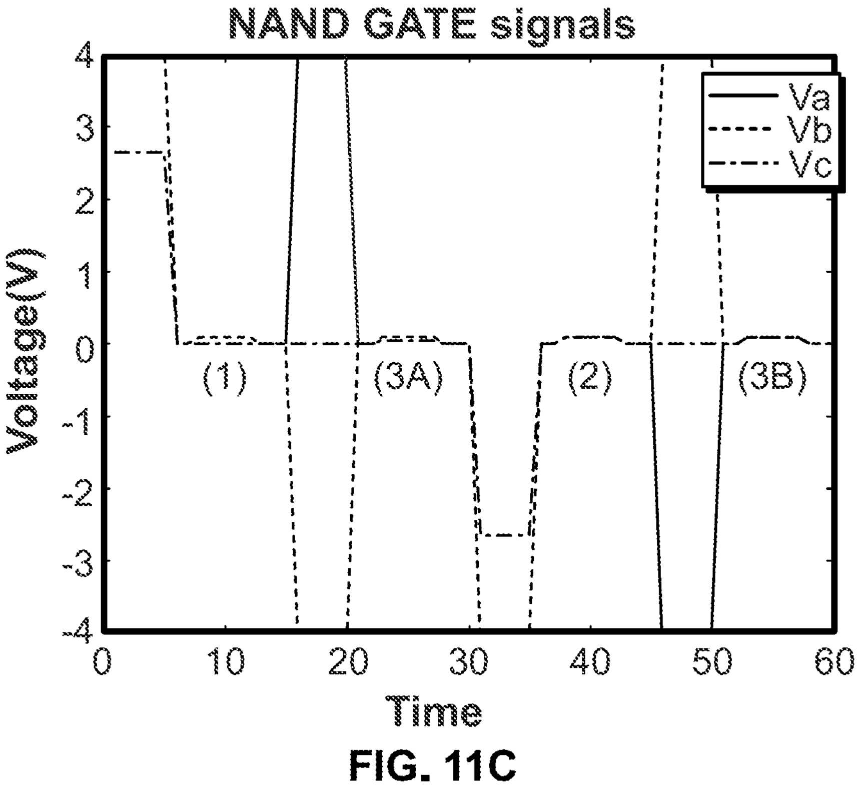

The two upper FTJ devices 1110A, 1110B may be written to using 2.0V write pulses or a −2.0 V write pulses to store logic "1" and logic "0" values, respectively. The state of the NAND circuit 1100 is determined by applying a 0.1 V read pulse to both of the upper FTJ devices 1110A, 1110B. The corresponding simulation results are illustrated in FIG. 11C, which discloses an error. When a logic "1" is stored, i.e., a 2.0 V write pulse is applied to both upper FTJ devices 1110A, 1110B, the output 1130 is approximately 0 V (indicative of a logic "0"), as expected, at position (1). When a logic "0" is stored, i.e., a −2.0 V write pulse is applied to both upper FTJ devices 1110A, 1110B, the output 1130 is approximately 0.1 V (indicative of a logic "1"), again as expected, at position (2). However, when the upper FTJ devices 1110A, 1110B are storing opposite logic values, the output 1130 takes one of two values, depending upon the previous state of the lower FTJ device 1120. When the lower FTJ device 1120 was previously in its high resistance state, i.e., the upper FTJ devices 110A, 1110B were both storing logic "0" values corresponding to position (2), the output 1130 will have the correct value of 0.1 V, as illustrated at position (3B). However, if the lower FTJ device 1120 was previously in its low resistance state, i.e., the upper FTJ devices 1110A, 1110B were both storing logic "1" values corresponding to position (1), the output 1130 will have an erroneous intervening value of approximately 0.05 V, as illustrated at position (3A). This erroneous intervening output state can be overcome by using a reset pulse to set the lower FTJ device 1120 in the correct, i.e., high resistance state.

Between the inverter circuit, for example, inverter circuit 800, and the NAND circuit, for example, the NAND circuit 1100, one has an irreducible set of circuits for implementing any desired digital logic function.

Nonvolatile Memory Cell

Figure 12A:
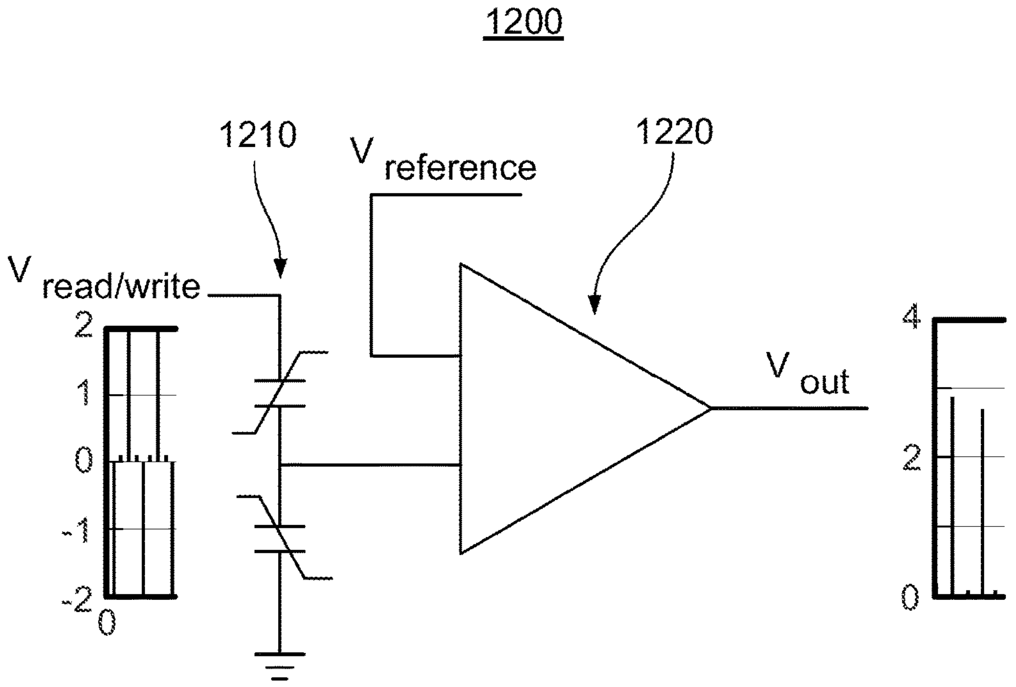
FIGS. 12A and 12B illustrate alternative nonvolatile memory cell circuits in accordance with one or more embodiments of the present invention.

A nonvolatile memory cell 1200, in accordance with at least one embodiment, employs an inverter circuit 1210, as illustrated in FIG. 12A. Although the topology of the nonvolatile memory cell 1200 is similar to that employed by many other logic architectures, such as ferroelectric random access memory (FeRAM) or static random access memory (SRAM), this topology capitalizes on the basic FTJ device with antisymmetric electrodes. By placing the inverter circuit 1210 at the input of a comparator 1220 (which may alternatively be implemented with a differential amplifier or amplifier), the state of the inverter circuit 1210, and thus the nonvolatile memory cell 1200, can be compared against a known reference voltage to read out memory states. Note that the nonvolatile memory cell 1200 is a hybrid circuit in that the inverter circuit 1210 is implemented using FTJ devices, while the comparator 1220 is preferably implemented using CMOS devices. Since the inverter circuit 1210 does not modify its memory state on a read, or when it is powered off, even if the comparator 1220 is powered off, the inverter circuit 1210, and thus the nonvolatile memory cell 1200, retains its memory state. A subsequent power on will bring the memory state back to its previously stored state.

As illustrated in the inset portions of FIG. 12A, a logic "0" is written to the inverter circuit 1210 using a −2.0 V write pulse, with a 0.1 V read pulse. In contrast, a logic "1" is written to the inverter circuit 1210 using a 2.0 V write pulse, with a 0.1 V read pulse again being employed. As also illustrated in FIG. 12A, the same input to the inverter circuit 1210 is used for applying both the write and the read pulses. As the output pulse will have a voltage of either approximately 50 μV (indicative of memory state corresponding to a logic “0”) or approximately 3 mV (indicative of memory state corresponding to a logic “1”), the reference voltage should be set at an intervening voltage, for example, 1 mV.

Figure 12B:
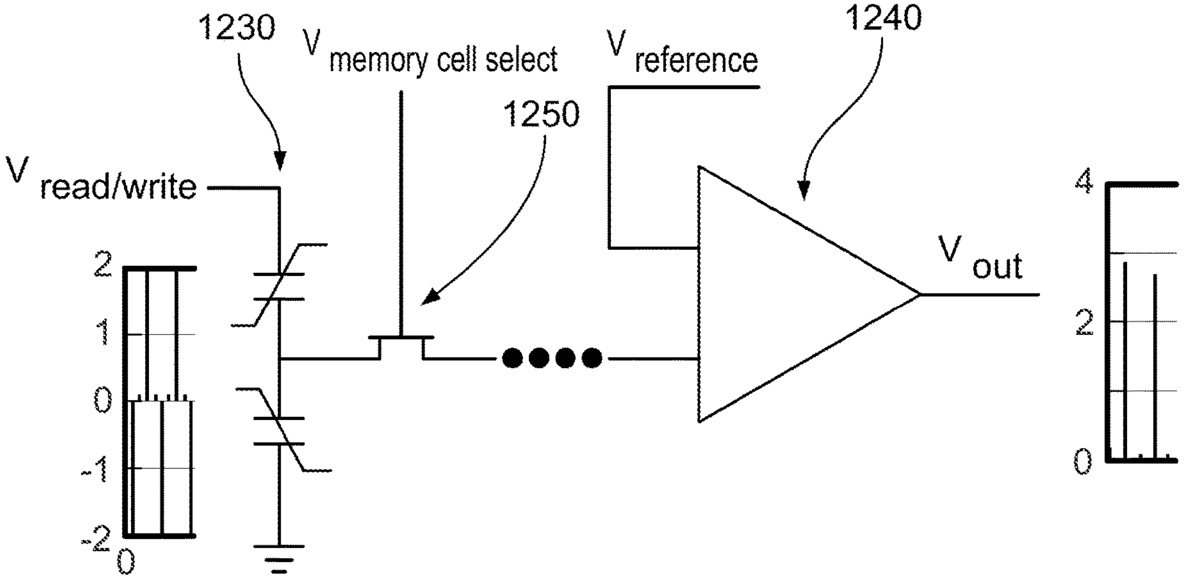

One variation on the nonvolatile memory cell just described is illustrated in FIG. 12B. In this variation, multiple inverter circuits 1230 are selectively electrically coupled to a common comparator 1240 using corresponding memory cell select switches 1250. By sharing the overhead of the common comparator 1240 across multiple inverter circuits 1230, the overhead per individual memory cell is reduced. Note that when a specific inverter circuit 1230 is being written to, it need not be coupled to the common comparator 1240, i.e., the memory cell select switch 1250 assigned to that inverter circuit 1230 need not be turned on. While the inverter circuits 1230 are implemented using FTJ devices, the common comparator 1240 and the memory cell select switches 1250 are preferably implemented using CMOS devices. This hybrid nonvolatile memory cell saves real estate as the multiple inverter circuits 1230 are vertically stacked on the common comparator 1240 and the memory cell select switches 1250, thereby reducing the memory’s footprint.

Multi-Input Comparison Circuit

Figure 13:
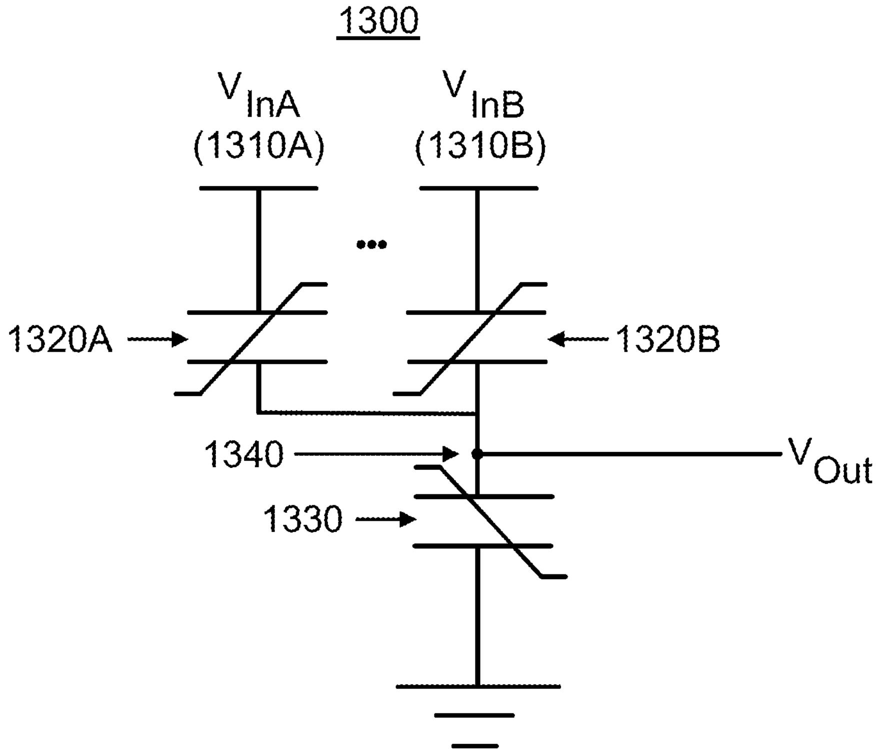
FIG. 13 illustrates a multi-input comparison circuit in accordance with one or more embodiments of the present invention.

FIG. 13 illustrates a multi-input comparison circuit 1300. The multi-input comparison circuit 1300 may have two or more inputs, with the embodiment illustrated in FIG. 13 including just two inputs 1310A, 1310B coupled to two corresponding upper FTJ devices 1320A, 1320B, each being PL devices. The output ends of the two upper FTJ devices 1320A, 1320B are coupled to the input of a lower FTJ device 1330, being a PH device. This common intervening node between the three FTJ devices 1320A, 1320B, 1330 corresponds to the output 1340 of the multi-input comparison circuit 1300. The opposite end of the lower FTJ device 1330 is grounded.

For the multi-input comparison circuit 1300, if a 2.0 V write pulse is applied to the input 1310A, the upper FTJ device 1320A enters its high resistance state when a 0.1 V read pulse is applied and the lower FTJ device 1330 enters its low resistance state for the 0.1V read pulse. Under these conditions, the voltage of the output pulse at the output 1340 would be approximately zero volts. Similarly, if a −2.0 V write pulse is applied to the input 1310B, the upper FTJ device 1320B enters its low resistance state when a 0.1 V read pulse is sent by it and the lower FTJ device 1330 enters its high resistance state for the 0.1V read pulse. Under these conditions, the voltage of the output pulse at the output 1340 would be approximately 0.1 V. From the viewpoint of the upper FTJ device 1320A, it left the lower FTJ device 1330 in the low resistance state and the upper FTJ device 1320A remained in its high resistance state. Now if the upper FTJ device 1320A sends another read 0.1 V pulse, the voltage of the output pulse at the output 1340 will be at approximately 0.05 V, i.e., in the “½” state, which will not change the resistance state of the lower FTJ device 1330. This ½ state indicates that there is a mismatch between the resistance states of the upper FTJ devices 1320A, 1320B. (This ½ state may also be employed as an error state if all of the inputs 1310A, 1310B are supposed to be in the same state, but are not.) If the upper FTJ device 1320B sends another read 0.1 V pulse, the voltage of the output pulse at the output 1340 would go to approximately 0.1 V. If there is not a mismatch between the resistance states of the upper FTJ devices 1320A, 1320B, the voltage of the output pulse at the output 1340 will be approximately 0.1 V or 0 V if both of the upper FTJ devices 1320A, 1320B are in their low resistance states or high resistance states, respectively. A sample sequential truth table can be found in Table 1.

TABLE 1

Sequential Truth Table for a Multi-Input Comparison Circuit.

| FTJ Device Type → Input/Output | | | NbN/ HZO/Nb Resistance State | NbN/ HZO/Nb | Nb/ HZO/NbN |
|---|---|---|---|---|---|
| Input 1310A | Input 1310B | Output 1340 | 1320A | 1320B | 1330 |
| −2.0 V | Open | | Low | | Low |
| 0.1 V | Open | High | Low | | High |
| Open | −2.0 V | | | Low | Low |
| Open | 0.1 V | High | | Low | High |
| 0.1 V | 0.1 V | High | Low | Low | High |
| 2.0 V | Open | | Low | | Low |
| 0.1 V | Open | Low | High | | Low |
| Open | 0.1 V | ½ | High | Low | Low |
| Open | 2.0 V | | High | Low | Low |
| Open | 0.1 V | Low | High | High | Low |
| 0.1 V | Open | Low | High | High | Low |
| 0.1 V | 0.1 V | Low | High | High | Low |
| −2.0 V | Open | | Low | High | Low |
| 0.1 V | Open | High | Low | High | High |
| Open | 0.1 V | ½ | Low | High | High |
| 0.1 V | 0.1 V | ½ | Low | High | High |
| Open | 2.0 V | | Low | Low | Low |
| Open | 0.1 V | Low | Low | High | Low |
| 0.1 V | Open | 1/2 | Low | High | Low |

One variation on the multi-input comparison circuit just described relates to the sizing of the upper FTJ devices. Specifically, if each upper FTJ device has a different area, then the ½ state, which occurs when all the upper FTJ devices have the same area, becomes an intermediate state, with the specific output voltage in this intermediate state being a function of the area of the mismatched upper FTJ device.

Fabrication of Complementary Ferroelectric Logic Devices

Figure 14:
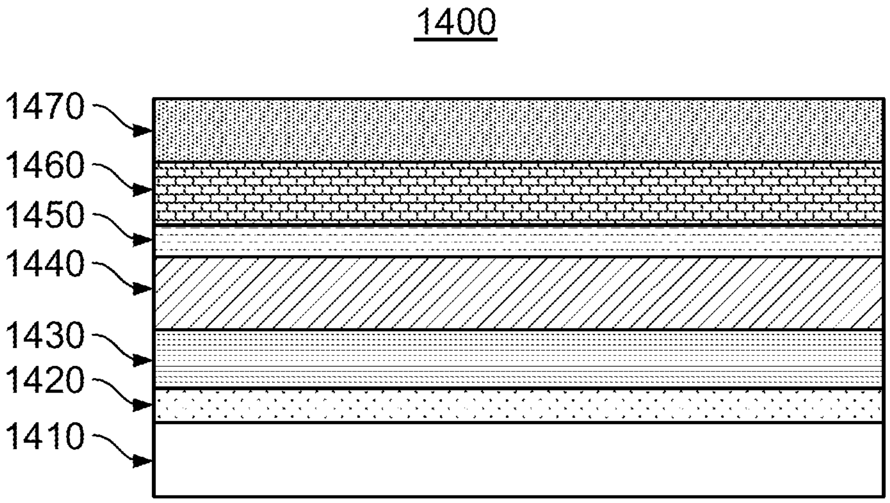
FIG. 14 illustrates, in cross-section, a material structure that may be employed for creating devices and circuits in accordance with one or more embodiments of the present invention.

FIG. 14 illustrates, in cross-section, an exemplary material structure 1400 that may be employed for creating the various FTJ devices and CFL circuits for one or more embodiments. The material structure 1400 includes a substrate 1410. While for demonstration purposes the substrate 1410 may be a Si substrate, in other embodiments, the substrate may be or include Si CMOS-based devices and circuits. In yet other embodiments, the substrate 1410 may be formed of other semiconductor (for example, IV, III-V, or II-VI semiconductors) or dielectric (for example, sapphire) materials.

A BE layer 1430 is formed on the substrate 1410, with or without an optional intervening layer 1420. This intervening layer 1420 may be an adhesion layer to ensure the BE layer 1420 adheres to the substrate 1410. In this case, the adhesion layer may, for example, be formed of Ti, Cr, TiN, or a Ti-silicide, and have a thickness of, for example, 50-150 nm. An alternative intervening layer 1420 may be a dielectric layer to insulate the FTJ devices and CFL circuitry from the substrate 1410. In this case, the dielectric layer may, for example, be formed of $SiO_2$ or SiN. Yet another alternative intervening layer 1420 may be a template layer that helps the subsequently grown layers to have the correct crystalline structure and orientation. In this case, the template layer may, for example, be formed of Cr, TiN, or a Ti-silicide.

The BE layer 1430 is typically formed of NbN or Nb, depending upon the device or circuit. The BE layer 1430 may, for example, be formed by any suitable means, including, for example, sputtering. The BE layer 1430 may, for example, have a thickness of approximately 100 nm to approximately 300 nm. In other embodiments, the BE layer 1430 may be or include, for example, Co, Cu, Ge, Ir, $IrO_2$, Ni, Pd, Pt, $RuO_2$, Si, Ta, TaN, TiN, or W.

A ferroelectric layer 1440 is formed on the BE layer 1430. The ferroelectric layer 1440 may be formed by any suitable means, including, for example, atomic layer epitaxy (ALD), sputter deposition, ion beam sputter deposition, or high-power impulse magnetron sputtering (HiPEMS). The ferroelectric layer 1440 may, for example, have a thickness of approximately 1 nm to approximately 30 nm, though a more typical thickness is between approximately 3 nm and approximately 10 nm. The ferroelectric layer may include $HfO_2$ or HZO. In other embodiments, the ferroelectric layer 1440 may be or include, for example, Al, Ba, Be, Ca, Ce, Dy, Er, Eu, Ga, Gd, Ge, Hf, Ho, La, Lu, Mg, N, Nb, Nd, O, Pr, Sc, Si, Sm, Sr, Y, Yb, or Zr.

An optional insulator layer 1450 may be formed on the ferroelectric layer 1440, though in other embodiments, the insulator layer 1450 may be formed between the BE layer 1430 and the ferroelectric layer 1440. The insulator layer 1450 may be formed by any suitable means, including, for example, sputtering or chemical vapor deposition. The insulator layer 1450 may, for example, have a thickness of approximately 0.5 nm to approximately 3 nm. The insulator layer 1450 may include, for example, $AlO_x$, $SiO_2$, SiN, or $TaO_x$.

A TE layer 1460 is formed on the ferroelectric layer 1440, or the insulator layer 1450 if present. The TE layer 1460 is typically formed of NbN or Nb, and will typically be the opposite of the BE layer 1430. The TE layer 1460 may, for example, be formed by any suitable means, including, for example, sputtering. The TE layer 1460 may, for example, have a thickness of approximately 10 nm to approximately 30 nm. In other embodiments, the TE layer 1460 may be or include, for example, Co, Cu, Ge, Ir, $IrO_2$, Ni, Pd, Pt, $RuO_2$, Si, Ta, TaN, TiN, or W.

An optional contact electrode layer 1470 may be formed on the TE layer 1460. The contact electrode layer 1470 is typically formed of Ti/Pt. The contact electrode layer 1470 may, for example, be formed by any suitable means, including, for example, sputtering. The contact electrode layer 1470 may, for example, have a thickness of approximately 100 nm to approximately 300 nm. In other embodiments, the contact electrode layer 1470 may be or include, for example, Al, Au, Co, Cu, Ni, Pt, Ta, TaN, Ti, or TiN/W. To ensure the correct crystalline structure and orientation of the ferroelectric layer 1440, the material is subjected to a rapid thermal anneal process, for example, at 580° C. for 90 seconds in an Ar atmosphere.

When fabricating individual FTJ devices or CFL circuits, the contact electrode layer 1470 may be patterned to form an etch mask for the rest of the device/circuit. The portion of the TE layer 1460 not protected by the contact electrode layer 1470 etch mask may be removed using a plasma process, for example, an $SF_6$-based plasma etch process. The portion of the ferroelectric layer 1440 not protected by the contact electrode layer 1470 etch mask may likewise be removed using a plasma process, for example, a $Cl_2$-based plasma etch process. Additional masking and dry etching (for example, an $SF_6$-based plasma etch process) steps may be employed to define the BE layer 1430. In other embodiments, other dry and/or wet etching processes may be employed to define the individual FTJ devices or CFL circuits.

With proper process planning, the FTJ devices or CFL circuits can be fabricated as part of a back-end-of-line (BEOL) CMOS-compatible process. These embodiments may employ, for example, a maximum processing temperature of 400° C.

Potential Applications of CFL

With the above described CFL circuits, including invertor (NOR), NAND, and memory cells circuits, one could implement many desired functions. Perhaps the memory cell circuits hold the greatest potential as this may provide memory wherever it is needed in an overall Si/CFL hybrid die. For example, with CFL memory cell circuits, one can vertically integrate memory above processors, thereby avoiding potentially congested data buses.

Another application where CFL circuits hold great potential is for low power applications. As described above, the memory cells retain their data even when the power is turned off, thereby reducing the power required for low power applications that require infrequent data stores and reads.

Yet another application where CFL circuits hold great potential is with radiation hardened applications. As described in Sun, the ferroelectric layers used in FTJ devices, and their corresponding CFL circuits, are relatively insensitive to radiation. Q. Sun et al., "Total ionizing dose effects of $^{60}$Co γ-rays radiation on $Hf_xZr_{1-x}O_2$ ferroelectric thin film capacitors," Journal of Materials Science: Materials in Electronics, vol. 31, pp. 2049-2056 (2020). As such, CFL circuits may find ready application in space-based applications where radiation effects can be of concern with standard CMOS circuitry.

All publications, including but not limited to patents and patent applications, cited in this specification are herein incorporated by reference as though set forth in their entirety in the present application.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A device, comprising:

an upper ferroelectric tunnel junction (FTJ) device adapted to be in one of a high or a low resistance state, a ratio of resistances in the high resistance state to the low resistance state being at least approximately five, to receive a write pulse, and to receive a subsequent read pulse; and a lower FTJ device electrically connected to the upper FTJ device at an intervening node, the lower FTJ device adapted to be in one of the high or the low resistance state;

wherein:

the write pulse is adapted to place each of the upper and lower FTJ devices in a corresponding one of the high or the low resistance state; and the subsequent read pulse is adapted to cause the device to output, at the intervening node, an output pulse indicative of a logic state of the device.

2. The device of claim 1, wherein each of the upper and lower FTJ devices includes a metal-ferroelectric-metal (MFM) device.

3. The device of claim 2, wherein the metal in the MFM device includes one or more of Co, Cu, Ge, Ir, $IrO_2$, Nb, NbN, Ni, Pd, Pt, $RuO_2$, Si, Ta, TaN, TiN, or W.

4. The device of claim 2, wherein a first metal that forms a first metal layer of the MFM device is different from a second metal that forms a second metal layer of the MFM device.

5. The device of claim 4, wherein the intervening node electrically connects the second metal of the upper FTJ device with the first metal of the lower FTJ device.

6. The device of claim 4, wherein the intervening node electrically connects the second metal of the upper FTJ device with the second metal of the lower FTJ device.

7. The device of claim 2, wherein the ferroelectric in the MFM device includes one or more of Al, Ba, Be, Ca, Ce, Dy, Er, Eu, Ga, Gd, Ge, Hf, Ho, La, Lu, Mg, N, Nb, Nd, O, Pr, Sc, Si, Sm, Sr, Y, Yb, or Zr.

8. The device of claim 1, wherein each of the upper and lower FTJ devices includes a respective NbN—$HfO_2$—Nb or NbN—HZO—Nb device.

9. The device of claim 1, wherein each of the upper and lower FTJ devices includes a respective metal-ferroelectric-insulator-metal (MFIM) device.

10. The device of claim 9, wherein the insulator in the MFIM device includes one or more of $AlO_x$, $SiO_2$, SiN, or $TaO_x$.

11. The device of claim 1, wherein a magnitude of the write pulse is a function of a composition and a thickness of a ferroelectric layer in each of the upper and lower FTJ devices.

12. The device of claim 1, wherein a magnitude of the write pulse is at least approximately 2.0 V.

13. The device of claim 1, wherein a magnitude of the read pulse is approximately 0.1 V.

14. A device, comprising:

an upper ferroelectric tunnel junction (FTJ) device adapted to be in one of a high or a low resistance state, to receive a write pulse, and to receive a subsequent read pulse; and a lower FTJ device electrically connected to the upper FTJ device at an intervening node, the lower FTJ device adapted to be in one of the high or the low resistance state;

wherein:

the write pulse is adapted to place each of the upper and lower FTJ devices in a corresponding one of the high or the low resistance state;

the subsequent read pulse is adapted to cause the device to output, at the intervening node, an output pulse indicative of a logic state of the device; and the device implements an inverter circuit.

15. A device, comprising:

an upper ferroelectric tunnel junction (FTJ) device adapted to be in one of a high or a low resistance state, to receive a write pulse, and to receive a subsequent read pulse; and a lower FTJ device electrically connected to the upper FTJ device at an intervening node, the lower FTJ device adapted to be in one of the high or the low resistance state;

wherein:

the write pulse is adapted to place each of the upper and lower FTJ devices in a corresponding one of the high or the low resistance state;

the subsequent read pulse is adapted to cause the device to output, at the intervening node, an output pulse indicative of a logic state of the device; and the device implements a NAND circuit; and the device further comprises a second upper FTJ device in parallel with the upper FTJ device, the second upper FTJ device electrically connected to the intervening node, the second upper FTJ device adapted to be in one of the high or the low resistance state, the second upper FTJ adapted to receive a second write pulse, and the second write pulse adapted to place each of the second upper and lower FTJ devices in a corresponding one of the high or the low resistance state.

16. The device of claim 1, wherein the device implements a nonvolatile memory cell; and the device further comprising a comparator electrically connected to the intervening node, the comparator adapted to compare the output pulse to a reference voltage, and the comparator adapted to output a stored logic state based upon the comparison of the output pulse to the reference voltage.

17. The device of claim 16, the device further comprising a memory cell select switch electrically connected on an input side to the intervening node and electrically connected on an output side to the comparator, the memory cell select switch adapted to selectively electrically couple the intervening node to the comparator.

18. The device of claim 1, wherein the device implements a multi-input comparison circuit;

the device further comprising one or more additional upper FTJ devices in parallel with the upper FTJ device, each of the one or more additional upper FTJ devices electrically connected to the intervening node, each of the one or more additional upper FTJ devices adapted to be in one of the high or the low resistance state, each of the one or more additional upper FTJ devices adapted to receive corresponding write pulses, and the corresponding write pulses adapted to place a corresponding one of the one or more additional upper FTJ devices and the lower FTJ device in a corresponding one of the high or the low resistance state; and wherein the logic state of the device is an intermediate logic state when resistance states of the upper FTJ device and the one or more additional upper FTJ devices are different.

19. The device of claim 18, wherein corresponding sizes of the upper FTJ device and each of the one or more additional upper FTJ devices are different;

wherein the logic state of the device is one of a plurality of intermediate logic states when resistance states of the upper FTJ device and the one or more additional upper FTJ devices are different; and wherein each of the plurality of intermediate logic states is indicative of which one of the upper FTJ device and the one or more additional upper FTJ devices is in a different resistance state.

* * * * *